United States Patent
Wollesen

Patent Number: 6,093,331
Date of Patent: Jul. 25, 2000

[54] BACKSIDE SILICON REMOVAL FOR FACE DOWN CHIP ANALYSIS

[75] Inventor: Donald L. Wollesen, Saratoga, Calif.

[73] Assignee: Advanced Micro Devices, Inc.

[21] Appl. No.: 08/988,681

[22] Filed: Dec. 11, 1997

[51] Int. Cl.[7] .................................. C23F 1/00; B44C 1/22
[52] U.S. Cl. .................................... 216/2; 216/2; 216/58; 216/63; 216/67; 216/74; 216/79; 216/83; 216/88; 216/89; 216/95; 216/96; 216/99
[58] Field of Search ................................ 438/4, 14, 15, 438/16, 17, 18, 710, 719; 250/307, 309, 491.1, 492.21; 257/351; 216/2, 58, 63, 67, 74, 79, 83, 88, 89, 95, 96, 99

[56] References Cited

U.S. PATENT DOCUMENTS

| | | | |
|---|---|---|---|
| 5,086,011 | 2/1992 | Shiota | 437/61 |
| 5,359,219 | 10/1994 | Hwang | 257/351 |
| 5,821,549 | 10/1998 | Talbot et al. | 250/307 |

Primary Examiner—Steven P. Griffin
Assistant Examiner—Eileen E. Nave
Attorney, Agent, or Firm—H. Donald Nelson

[57] ABSTRACT

A method for the precise removal of the backside silicon on face down semiconductor devices to obtain a planar surface to allow electron beam microprobe analysis of the semiconductor device. The backside silicon is removed by plasma etching in a fluorocarbon based chemical plasma. The epitaxial layer in a CMOS device acts as an etch stop and the buried oxide layer in an SOI device acts as an etch stop.

6 Claims, 2 Drawing Sheets

BACKSIDE SILICON REMOVAL FOR FACE DOWN CHIP ANALYSIS

BACKGROUND OF THE INVENTION

Cross Reference to Related Application

This application is related to application Ser. No. 08/988,868, filed on the filing date of this application, entitled DEVICE ANALYSIS FOR FACE DOWN CHIP, now U.S. Pat. No. 5,972,725, and assigned to the assignee of this application.

FIELD OF THE INVENTION

This invention relates generally to methods to prepare a semiconductor device for the precise measurement of electrical parameters in the semiconductor device. More specifically, this invention relates to a method to prepare a face down semiconductor device for the precise measurement of electrical parameters in the face down semiconductor device. Even more specifically, this invention relates to a method for the precise removal of backside silicon substrate material in face down semiconductor devices to allow for the precise measurement of electrical parameters in the face down semiconductor devices.

DISCUSSION OF THE RELATED ART

The solder-bump flip-chip interconnection technology was initiated in the early 1960s to eliminate the expense, unreliability, and low productivity of manual wirebonding. The flip-chip or controlled-collapse-chip connection ($C^4$ or C4) technology utilizes solder bumps deposited on wettable metal terminals on the chip and joined to a matching footprint of solder wettable terminals on the substrate. The upside-down chip (flip-chip or face down chip) is aligned to the substrate, and all joints are made simultaneously by reflowing the solder.

Semiconductor die are subjected to two basic sets of test procedures. The first set of test procedures is conducted while the die are still in wafer form and the second set of test procedures is conducted after the die have been separated and have been packaged. Test procedures have been developed for the testing and analysis of semiconductor die that are packaged face up. Because the face of the semiconductor die is facing down in a flip-chip, the face is unavailable for the test procedures developed for the more conventional face up semiconductor die.

Historically, one of the primary integrated circuit tools for electrical waveform analysis at the small micron to sub-micron level is the "electron-beam microprobe." The electron-beam microprobe is a specialized scanning electron microscope (SEM) configured to provide a visual image of integrated circuits on a die, with or without voltage contrast. Voltage contrast is available when the integrated circuits are electrically activated. The electron-beam microprobes are navigated to specific nodes in the integrated circuit on the semiconductor die based upon a computer database containing the actual physical layout of the integrated circuit on the semiconductor die. Once a node in the integrated circuit that is to be tested is located, the electron-beam is aimed at a specific conductive pattern on the die and senses what the electrical potential is at the node. Further actual electrical test patterns can be used to stimulate the device under test and the electron-beam's secondary electrons can be used to observe waveforms and timing patterns in the integrated circuit on the die. This capability is crucial during the debugging portion of the development phase of a new integrated circuit design and is a key tool to examine production test units and integrated circuits returned from field use. In order for an electron beam microprobe measurement system to work, the electron beam microprobe is best placed on a conductive interconnect line although alternating current (ac) charge can be sensed through a thickness of thousands of Angstroms (Å) of dielectric. However, the measurement conducted through dielectric having a significant thickness is not sufficiently accurate for precise determination of the electrical parameters of the integrated circuit.

Because the face of the flip-chip is facing down and is close to the packaging substrate, the nodes of the flip-chip are unavailable for the standard electron beam measurements.

Therefore, what is needed is a method to remove the backside substrate of a face down semiconductor device to allow precise measurement of electrical parameters in the face down semiconductor integrated circuits.

SUMMARY OF THE INVENTION

A method of removing the backside silicon from a face down semiconductor device in accordance with the present invention solves the above and other problems by providing a planar surface with no bevel angle between the resulting surface and the active surface of the semiconductor device.

The above and other objects and advantages of the present invention are attained by a method of removing the backside silicon substrate of a semiconductor device by plasma etching in a fluorocarbon based chemical plasma. A portion of the backside silicon substrate of the semiconductor device may be removed prior to the plasma etching by a mechanical lapping or a polishing procedure. The epitaxial layer or the lightly doped n well or p well regions in a conventional CMOS device act as an etch stop layer. The buried oxide layer in an SOI device acts as an etch stop layer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Figure 1:
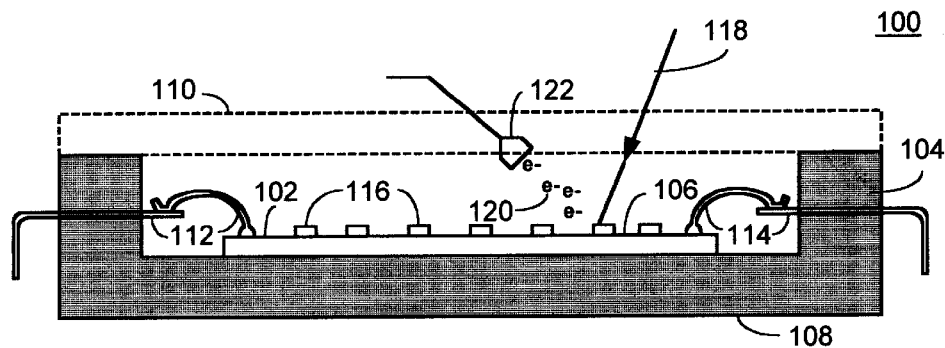
FIG. 1 shows a prior art face up semiconductor device showing the lid of the package removed and an electron beam microprobe directed at a specific node on the face of the semiconductor device and a detector to detect the secondary electrons scattered from the point of impact of the electron beam on the node.

Reference is now made in detail to a specific embodiment of the present invention that illustrates the best mode presently contemplated by the inventors for practicing the invention. Note that the conventions such as p+ and p– are given by way of example and that the corresponding dopant types and concentrations, although not critical to the present invention, would be apparent to a person skilled in the relevant art. The figures are diagrammatic and, for clarity, not drawn to scale. Corresponding parts are generally referred to by the same reference numerals.

FIG. 1 is a diagrammatic side view of a conventional prior art packaged face up semiconductor device 100. The semiconductor device 102 is shown in a hermetic package 104. The face 106 of the semiconductor device 102 is facing up, that is, away from the bottom 108 of the package 104. The lid 110 of the package 104 is shown in dotted line outline to indicate that the lid 110 has been removed to allow access to the face 106 of the semiconductor device 102. The structures 112 and 114 are metal leads connecting circuits in the semiconductor device 102 to electrical circuits (not shown) outside the package. The structures 112 and 114 are well known and will not be further discussed. The structures 116 represent nodes in the semiconductor device 102 that need to be tested to determine the functionality of the semiconductor device 102. The arrow 118 represents an electron beam microprobe directed at one of the nodes 116. A detector 122 detects the secondary electrons 120 resulting from the electron beam microprobe striking the node 116.

Figure 2:
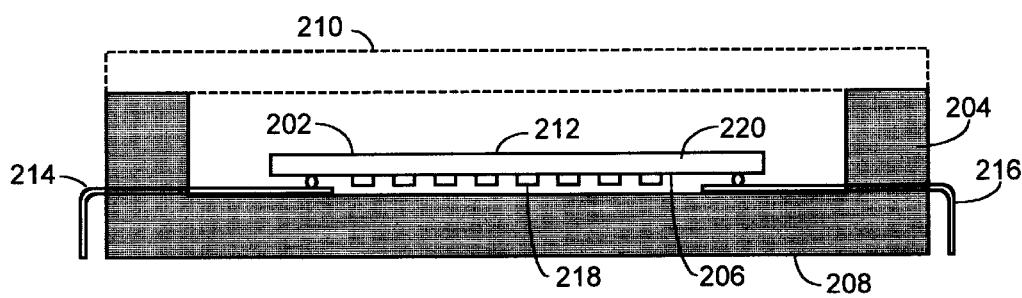
FIG. 2 shows a face down or flip-chip device showing the lid of the package removed to expose the backside of the semiconductor device.

FIG. 2 is a diagrammatic side view of a packaged face down semiconductor device 200. The semiconductor device 202 is shown in a hermetic package 204. The face 206 of the semiconductor device 202 is facing down, that is towards the bottom 208 of the package 204. The lid 210 of the package 204 is shown in dotted line outline to indicate that the lid 210 has been removed to allow access to the back 212 of the semiconductor device 202. The structures 214 and 216 are metal leads connecting the semiconductor device 202 to electrical circuits (not shown) outside the package. The nodes 218 that need to be tested are now inaccessible to the electron beam microprobe. Although the face down packaging arrangement has a number of performance advantages, the substrate 220 on which the semiconductor device 202 is built is too thick for the electrical signals at the nodes to couple to a SEM electron beam. The substrate 220 must be manufactured with a thickness adequate to provide mechanical support to the device and the package 204 must also be manufactured with a sufficient thickness to serve as a support system to provide mechanical integrity for the semiconductor device 202. Because the substrate 220 of the semiconductor device 202 and the package 204 have thicknesses that prevent penetration by electron beam microprobes, the measurement of electrical parameters of the face down semiconductor device 202 is extremely difficult, if not impossible, even with the lid 210 of the package 204 removed.

Figure 3:
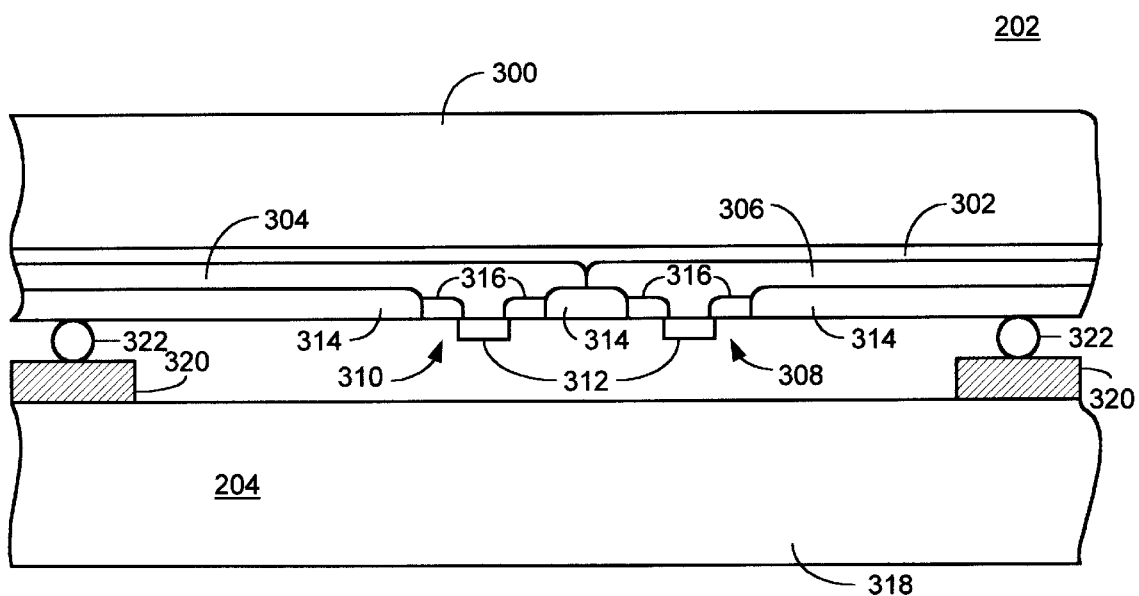
FIG. 3 shows a simplified example of a CMOS semiconductor device assembled and packaged face down including a p+ substrate, a layer of p– epitaxial silicon, a p-well and an n-well.

FIG. 3 is a simplified diagrammatic side view of the packaged face down semiconductor device 200 shown in FIG. 2. Only a small portion of the semiconductor device 202 is shown in FIG. 3 and includes a portion of a p+ substrate 300, a portion of a layer of p– epitaxial silicon 302, a portion of a p well 304, a portion of an n well 306, a p channel transistor 308 and an n channel transistor 310. The gates 312 of the transistors 308 and 310 are shown, not shown are the metal layers that are typically manufactured over the gate level of the transistors. The portions of the isolation regions 314 are shown along with source and drain regions 316 of the transistors 308 and 310. A portion 318 of the package 204 is shown with solder wettable terminals 320 on the package 204. The solder bumps 322 are typically deposited on wettable metal terminals (not shown) on the semiconductor device 202. The semiconductor device 202 is applied face down onto the package so that the solder bumps 322 are joined to a matching footprint of the solder wettable terminals 320 on the package 204.

Figure 4:
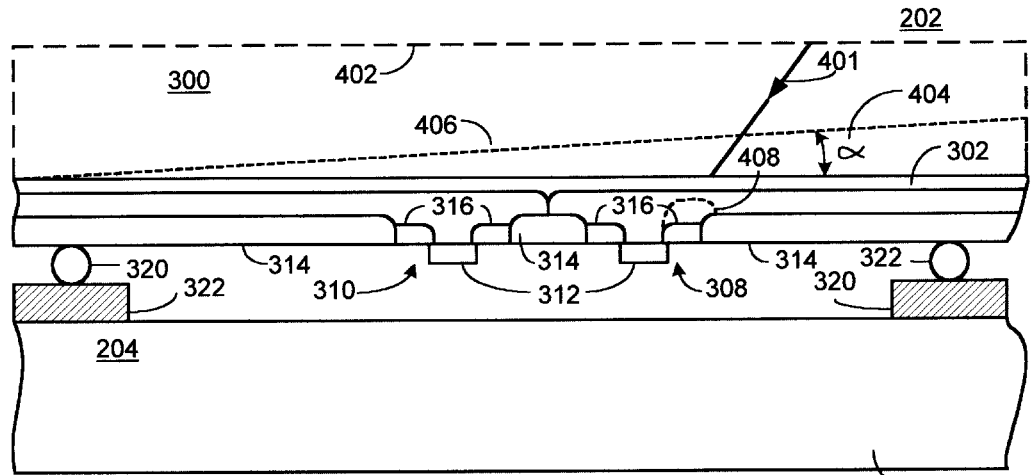
FIG. 4 shows the CMOS semiconductor device shown in FIG. 3 with the p+ substrate removed.

FIG. 4 shows the semiconductor device 200 shown in FIG. 3 with the substrate 300 shown in dashed outline 402. In order to utilize the electron beam microprobe 401 to measure electrical parameters in the semiconductor device 202 it is necessary to remove a majority, if not all, of the substrate 300 so the electron beam can couple with electrical structures in the semiconductor device 202. Mechanical lapping could be used to remove all or part of the semiconductor substrate 300, however, mechanical lapping has the well known characteristic of leaving a bevel angle α 404 of the lapped surface 406 with respect to the opposite side of the wafer. Although mechanical grinding or polishing to remove most of the backside of the die may be desirable, available mechanical grinding and polishing methods do not have the control accuracy to achieve the necessary absolute planarity of the surface and the necessary proximity of the surface to the active transistor surface of the semiconductor device 202.

To obtain the necessary proximity of the removed surface to the active transistor surface of the semiconductor device 202 it is necessary to use a method that will provide the necessary planarity. One such method is the use of a chemical or plasma etch procedure. The chemical or plasma etch procedure can be used to etch the desired portion of the semiconductor substrate 300 or it can be used to etch the remaining portion of the semiconductor substrate 300 after an initial mechanical grinding and polishing step. By way of example, the following plasma etch parameters may be used to carry out the process of this invention:

Drytek Quad R.I.E. Plasma etcher model number 824.

Pressure: 450 millitorr.

Power: 400 watts on a 9.0 inch diameter aluminum electrode with a 4.0 inch wafer.

Bias: 10 volts.

Electrode Spacing: 1.75 inches.

Etchants: 20 sccm Freon 12, and 80 sccm chlorine.

Other plasma etch parameters may be used to remove the silicon substrate.

Many integrated circuit processes, for example, bipolar or CMOS on epitaxial silicon, are candidates for using an etch that will etch p+ (heavily doped p type silicon) and not etch p– (lightly doped p type silicon). This concept is disclosed in U.S. Pat. No. 5,086,011 entitled "Process for Producing Thin Single Crystal Silicon Islands on Insulator" by Philip S. Shiota and is incorporated herein by reference in its entirety. This patent teaches that with proper fluorine and chlorine in a plasma etch environment, the etch will preferentially etch "p++" boron doped silicon about 10 to 20 times the rate of lightly doped silicon and will etch "n++" silicon about 15 times faster than n– silicon. The patent to Shiota also discloses that a polymer will form on the lightly doped regions that are under the heavily doped regions. The polymer effectively stops further etching of the lightly doped silicon.

Referring again to FIG. 4 the substrate 300 is shown etched away by plasma etching in an appropriate fluorocarbon based chemical plasma. The plasma etch will remove the p+ portion of the semiconductor device 202. The package substrate 204 will provide mechanical support via the solder bump 322 structures for the now ultra-thin active regions of the semiconductor device 202. Although the substrate has been removed, the circuits on the semiconductor device 202 are still functional. The electron beam microprobe 401 can be positioned according to an x-y coordinate system by the physical die database in the electron beam computer. Reference to the die edges may be used as a basis for x-y positioning. Although it is unlikely to get any dc potential on any transistor nodes, the potential on the substrate and the opposing well structures can be measured directly. Furthermore, like the case of the electron beam microprobe measuring interconnect signals with interconnects buried in oxide interconnect dielectric, any ac potential on n+ or p+ source/drain junctions results in changing the depletion regions, one of which is indicated at 408. Thus, because the epitaxial region 302 may have a thickness on the order of 1–10 $\mu$m, and because the epitaxial region 302 are lightly doped, the moving charge in the exposed ultra-thin epitaxial region 302 and the localized ac signal potential may be observed with an electron beam microprobe. This technique provides a completely new technique for any face down application that can be put in an electron beam microprobe chamber.

Figure 5:
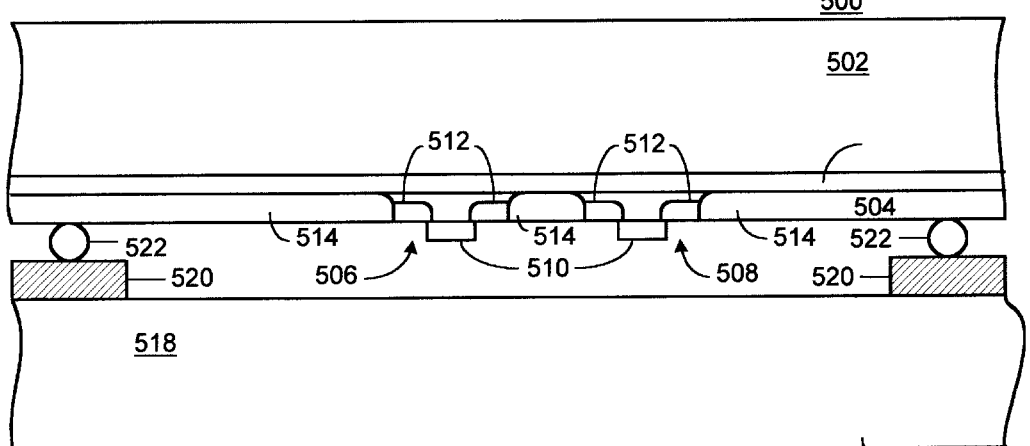
FIG. 5 shows a CMOS semiconductor device on an SOI die.

FIG. 5 is a simplified diagrammatic side view of an SOI (silicon on insulator) semiconductor device 500. Only a small portion of the SOI device 500 is shown and includes a portion of the silicon substrate 502 and a buried oxide layer 504 of $SiO_2$. The active region of the semiconductor device 500 is represented by two transistors, 506 and 508, with gates 510, source/drain regions 512 and isolation regions 514. A portion 516 of the package substrate 518 is shown with solder wettable terminals 520 on the package 518. The solder bumps 422 are typically deposited on wettable metal terminals (not shown). The semiconductor device 500 is applied face down onto the package 518 so that the solder bumps 522 are joined to a matching footprint of the solder wettable terminals 520 on the package 518.

Figure 6:
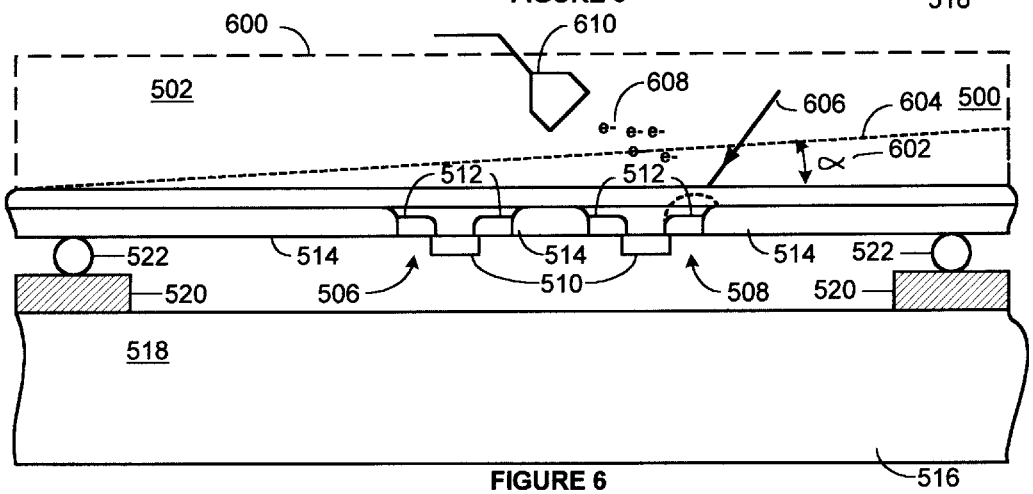
FIG. 6 shows the CMOS semiconductor device shown in FIG. 5 with the substrate silicon removed to allow electron-beam analysis.

FIG. 6 shows the semiconductor device 500 shown in FIG. 5 with the substrate 502 shown in dashed outline 600.

Similar to the non-SOI semiconductor device discussed above in conjunction with FIGS. 3 and 4, the SOI structure requires the substrate 502 to be removed in order to utilize the electron beam microprobe to measure electrical parameters in the semiconductor device 500. In the case of an SOI structure 500, a wider range of etchants may be used to remove the substrate 502. Because most silicon plasma etches will typically not etch $SiO_2$, the layer of $SiO_2$ 504 can be used as an etch stop. Wet chemical silicon etch materials such as KOH and Pyrocatecol will etch silicon, but will not etch dielectrics such as $SiO_2$ so they can be used to etch the silicon substrate on an SOI device. The dotted line 604 and the bevel angle $\alpha$ 602 illustrates the bevel that typically results if a mechanical grinding and polishing is used to remove the substrate 502. The arrow 606 shows the electron beam microprobe being directed onto a selected feature of the semiconductor device 500. The detector 610 detects the secondary electrons 608.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of removing the silicon substrate material from the backside of a face down semiconductor device, the method comprising plasma etching in a fluorocarbon based chemical plasma.

2. The method of claim 1 further comprising mechanically removing a portion of the silicon substrate material prior to plasma etching.

3. The method of claim 2 wherein the semiconductor device is a CMOS device on an epitaxial layer.

4. The method of claim 3 wherein the epitaxial layer serves as an etch stop layer.

5. The method of claim 2 wherein the semiconductor device is an SOI device on a buried oxide layer.

6. The method of claim 5 wherein the buried oxide layer serves as an etch stop layer.

* * * * *